United States Patent
Volstorf (12)

(10) Patent No.: US 6,717,825 B2
(45) Date of Patent: Apr. 6, 2004

(54) ELECTRICAL CONNECTION SYSTEM FOR TWO PRINTED CIRCUIT BOARDS MOUNTED ON OPPOSITE SIDES OF A MID-PLANE PRINTED CIRCUIT BOARD AT ANGLES TO EACH OTHER

(75) Inventor: James R. Volstorf, Mechanicsburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 59 days.

(21) Appl. No.: 10/051,703

(22) Filed: Jan. 18, 2002

(65) Prior Publication Data

US 2003/0137817 A1 Jul. 24, 2003

(51) Int. Cl.$^7$ ................................................ H05K 1/14
(52) U.S. Cl. ........................ 361/803; 361/777; 361/788; 174/262
(58) Field of Search ................................ 361/767, 768, 361/777, 780, 784, 788, 794, 803; 174/250, 255, 261, 262

(56) References Cited

U.S. PATENT DOCUMENTS

| | | | |
|---|---|---|---|
| 3,680,037 A | * 7/1972 | Nellis et al. ................ 439/591 |
| 4,472,765 A | * 9/1984 | Hughes ....................... 361/791 |
| 4,575,780 A | 3/1986 | Brombal et al. ............ 361/788 |
| 4,703,394 A | 10/1987 | Petit et al. ................... 361/790 |
| 4,838,798 A | 6/1989 | Evans et al. .................... 439/61 |
| 4,907,977 A | 3/1990 | Porter ........................... 439/74 |
| 5,019,945 A | * 5/1991 | Smolley ..................... 361/803 |
| 5,062,801 A | 11/1991 | Roos ........................... 439/61 |
| 5,335,146 A | 8/1994 | Stucke ........................ 361/785 |
| 5,352,123 A | 10/1994 | Sample et al. ................. 439/61 |
| 5,488,541 A | 1/1996 | Mistry et al. ................ 361/788 |
| 5,887,158 A | 3/1999 | Sample et al. ................ 716/15 |
| 5,926,378 A | 7/1999 | DeWitt et al. ............... 361/788 |
| 6,528,737 B1 | * 3/2003 | Kwong et al. ............... 174/262 |
| 6,538,899 B1 | * 3/2003 | Krishnamurthi et al. .... 361/788 |

* cited by examiner

*Primary Examiner*—John B. Vigushin
(74) *Attorney, Agent, or Firm*—Woodcock Washburn LLP (57) ABSTRACT

Two connector printed circuit boards with electrical connections are mounted on opposite sides of a mid-plane printed circuit board at angles to each other. Via holes are positioned on the faces of the mid-plane board according to one of two schemes. In the first scheme, the via holes are positioned along an axis perpendicular to an axis that bisects the angle of misalignment of the connector boards, and the via holes are equidistant from a point on the axis that bisects the angle of misalignment of the connector boards. In the second scheme, the via holes are positioned along an axis that bisects the angle of misalignment of the connector boards, and the via holes are equidistant from the electrical connections.

23 Claims, 8 Drawing Sheets

ELECTRICAL CONNECTION SYSTEM FOR TWO PRINTED CIRCUIT BOARDS MOUNTED ON OPPOSITE SIDES OF A MID-PLANE PRINTED CIRCUIT BOARD AT ANGLES TO EACH OTHER

BACKGROUND OF THE INVENTION

1. Field of the Invention

The present invention relates to electrical connections of two printed circuit boards surface mounted on opposite sides of a mid-plane printed circuit board at angles to each other. Specifically, the invention is a routing scheme providing a direct electrical path between electrical connections.

2. Description of the Prior Art

Modern electronic devices such as computers must be able to perform complex functions both quickly and effectively. Thus, it is essential that the internal hardware of these electrical devices is connected in an efficient manner. A common hardware assembly technique involves two printed circuit boards, commonly referred to as daughter boards, that are connected to opposite sides of a mid-plane printed circuit board, commonly referred to as a mother board. These daughter boards are often connected at angles to each other. For the electrical device to function as desired, the electrical components on one daughter board must be able to transmit and receive electrical signals to and from the electrical components on the other daughter board.

There are several devices known in the prior art that provide such an electrical connection between two daughter boards. For example, Petit et al. describe in U.S. Pat. No. 4,703,394 a system for interconnecting orthogonally disposed printed circuit boards. This system involves the use of four multiway connectors. Two of the connectors are mounted on respective facing edges of the connector boards, and two of the connectors are mounted on opposite sides of the mid-plane board. The connectors mounted on the connector boards plug into the connectors mounted on the mid-plane board.

The interconnection system described in the Petit et al. requires the use of bulky connectors that makes its implementation undesirable in modern electrical devices which require a compact design.

Sample et al. describe in U.S. Pat. No. 5,887,158 a switching mid-plane and interconnecting system for interconnecting large numbers of signals. This system contains a mid-plane printed circuit board having a plurality of first connectors oriented in a first direction on one side of the mid-plane for making connections to the plurality of first printed-circuit boards. The mid-plane printed-circuit board also has a plurality of second connectors oriented in a second direction orthogonal to the plurality of first connectors on the other side of the mid-plane. The connectors are positioned such that connection pins on the plurality of first connectors and plurality of second connectors in regions of intersection are double-ended pins common to both. The remaining connection pins of the plurality of first connectors are single-ended connection pins which are connected to the single-ended connection pins of the plurality of second connectors via conductive traces on the mid-plane printed-circuit board.

The interconnection system described in the Sample et al. is subject to two important drawbacks relating to the connection of the single ended connection pins. First, the electrical path connecting the single ended connection pins may vary in length. If the contacts are used for differential signals, this presents a problem because a longer electrical path may result in signals which are out of phase. Additionally, the electrical path connecting the single ended pins may run through the mother board diagonally rather than straight (at an angle perpendicular to the top and bottom side of the mother board). This diagonal electrical path presents a problem because it results in the entrance and exit of the electrical path into and out of the mother board to be misaligned, thereby creating the need for additional drilling in the mother board and further raising the complexity of the design.

Thus, there is a need for a connection system that provides a routing scheme in which the electrical paths between connections in each pair of connections are of equal length. Furthermore, there is a need for a connection system that provides a routing scheme in which the electrical path runs straight through the mother board so that the entrance and exit of the electrical path into and out of the mother board directly overlay one another. Additionally, it is desired that this connection system is a compact system that does not require the use of bulky connector plug-ins. A connection system with these and other improve characteristics is desired.

SUMMARY OF THE INVENTION

The present invention is an electrical connection system that includes two connector printed circuit boards surface mounted on opposite sides of a mid-plane printed circuit board at angles to each other. Each of the connector boards contains pairs of electrical connections. An electrical path connects each electrical connection on the first connector board to a corresponding electrical connection on the second connector board. This electrical path consists of three elements. The first element is preferably an electrically conductive surface mount pad connecting each electrical connection on the first connector board to a via hole on the first face of the mid-plane board. The second element is preferably a mid-plane electrical trace through two overlaying via holes on each face of the mid-plane board. This connection is straight through the mid-plane board at an angle perpendicular to each face of the board. The third element is preferably another electrically conductive surface mount pad connecting the via holes on the second face of the mid-plane board to the corresponding electrical connection on the second connector board.

The length of the mid-plane electrical trace is preferably equal to the width of the mid-plane board. However, the length of the surface mount pads may vary provided that the total length of the electrical path connecting the first connections in each pair of electrical connections is equal to the total length of the electrical path connecting the second connections in the pair.

In a preferred embodiment, each via hole in each pair is fixed on an axis perpendicular to an axis that bisects the angle of misalignment of the connector boards. Additionally, each via hole in each pair may be equidistant from a point on an axis that bisects the angle of misalignment of the connector boards. For the electrical paths connecting the first connections in each of the pairs of electrical connections, the first element will be a long surface mount pad and the third element will be a short surface mount pad. Conversely, for the electrical paths connecting the second connections in each of the pairs of electrical connections, the first element will be a short surface mount pad and the third element will be a long surface mount pad. Thus, the total length of the electrical path connecting the first connections in each pair of electrical connections is equal to the total length of the electrical path connecting the second connections in the pair.

In a another preferred embodiment, each via hole in each pair is fixed directly on an axis that bisects the angle of misalignment of the connector boards. In this embodiment, all surface mount pads are equal in length. Thus, the total length of the electrical path connecting the first connections in each pair of electrical connections is equal to the total length of the electrical path connecting the second connections in the pair.

BRIEF DESCRIPTION OF THE DRAWINGS

The present invention will be better understood after reading the following detailed description of the presently preferred embodiments thereof with reference to the appended drawings, in which.

DETAILED DESCRIPTION OF THE PRESENTLY PREFERRED EMBODIMENTS

A system which meets the above-mentioned objects and provides other beneficial features in accordance with the presently preferred exemplary embodiment of the invention will be described below with reference to FIGS. 1–8. Those skilled in the art will readily appreciate that the description given herein with respect to those figures is for explanatory purposes only and is not intended in any way to limit the scope of the invention. Throughout the description, like reference numerals will refer to like elements in the respective figures.

Figure 1:
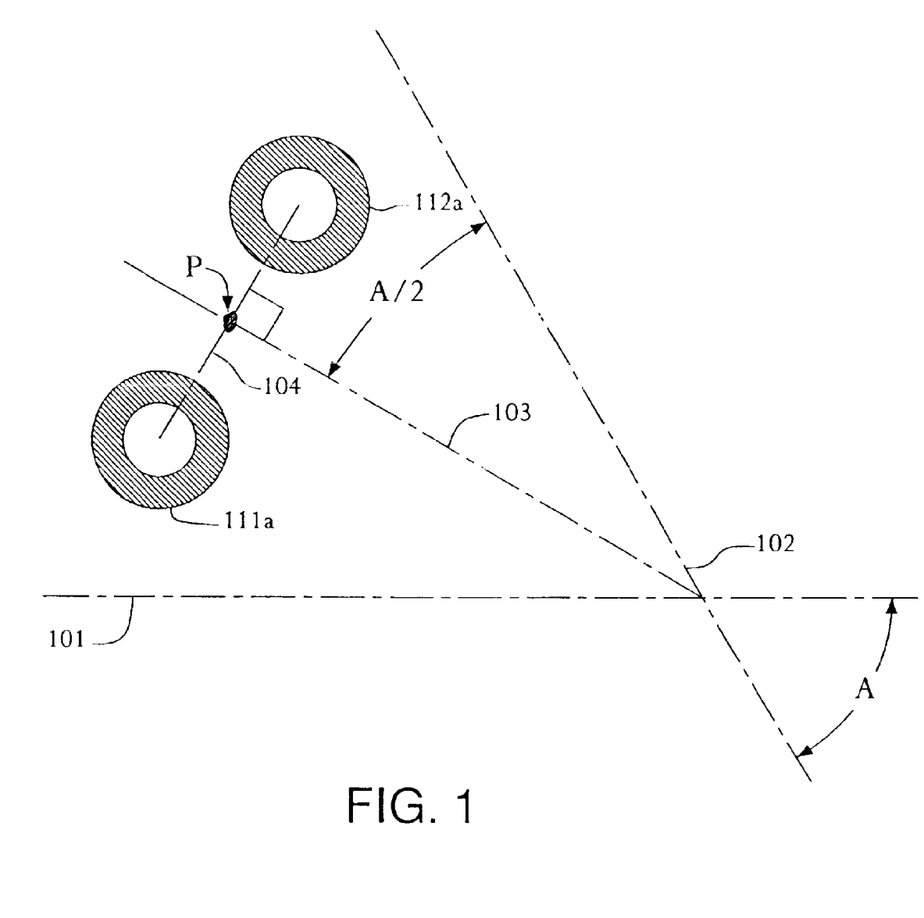
FIG. 1 illustrates a diagram of a first embodiment of the electrical connection system with the via holes fixed on an axis perpendicular to an axis that bisects the angle of misalignment of the connector boards.

FIG. 1 illustrates a diagram of a first embodiment of the electrical connection system with the via holes fixed on an axis perpendicular to an axis that bisects the angle of misalignment of the connector boards. Misalignment angle A represents the angle of misalignment of top connector board 101 and bottom connector board 102. Bisecting axis 103 bisects angle A. Perpendicular axis 104 intersects bisecting axis 103 at intersection point P at an angle perpendicular to bisecting axis 103. Top surface via holes 111a and 112a are fixed along perpendicular axis 104 and are equidistant from intersection point P.

Figure 2:
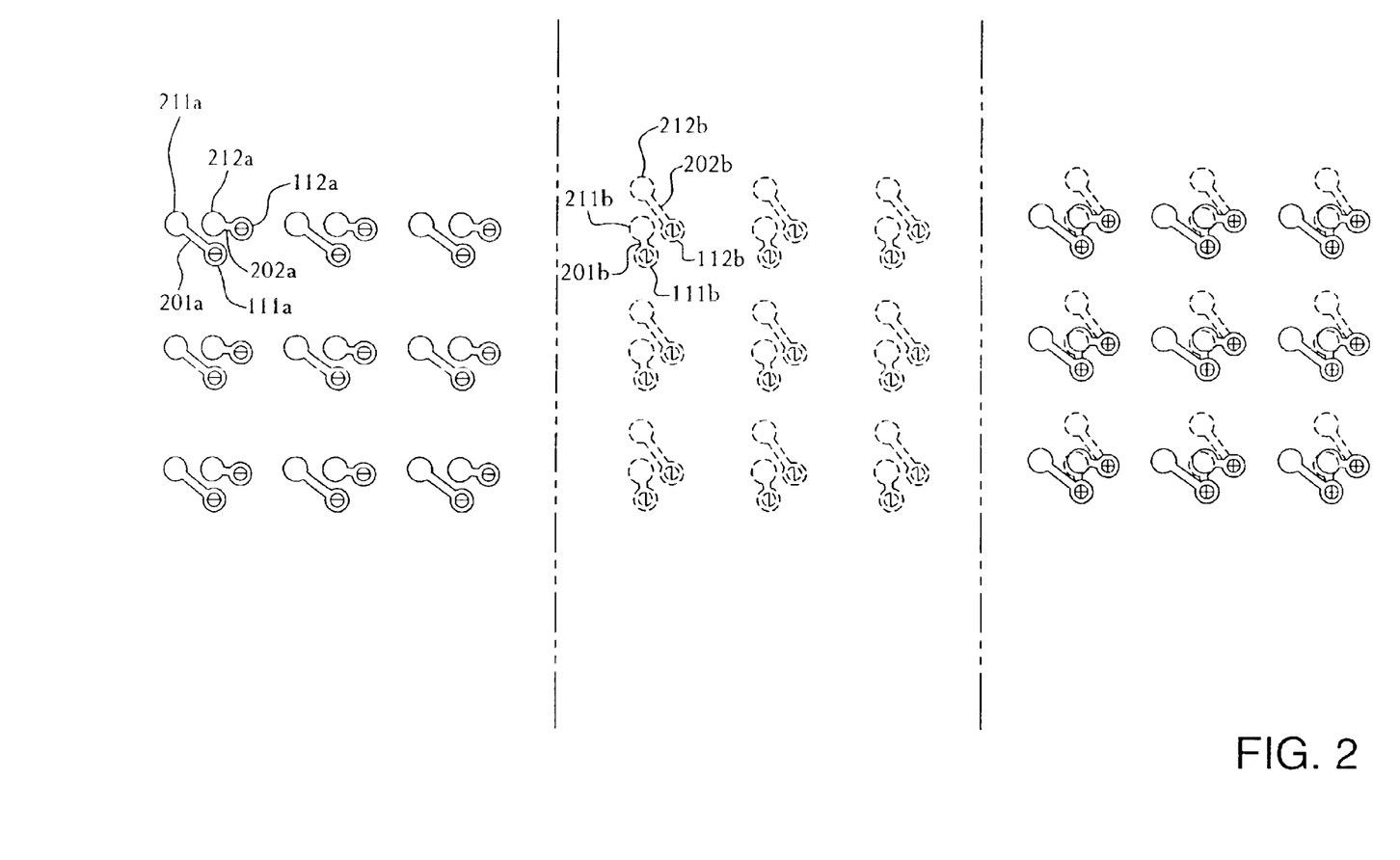
FIG. 2 illustrates a diagram of the first embodiment adapted to a solder on surface mount connector where the front and backside daughter boards are orthogonal to each other.

FIG. 2 illustrates a diagram of the first embodiment adapted to a solder on surface mount connector where the front and backside daughter boards are orthogonal (misalignment angle A=90 degrees). The first column of FIG. 2 illustrates a top view of the top surface of the PWB. Top surface mount pads 201a and 202a connect top daughter board connections 211a and 212a to via holes 111 and 112. The second column of FIG. 2 illustrates a top view of the bottom surface of the PWB. Bottom surface mount pads 201b and 202b (shown by dashed lines) connect bottom daughter board connections 211b and 212b to via holes 111 and 112. The third column of FIG. 2 illustrates a top view of the top surface and bottom surface of the PWB overlaid. Top first connection 211a is the outside connection on the top connector board, and bottom first connection 211b is the inside connection on the bottom connector board. Conversely, top second connection 212a is the inside connection on the top connector board, and bottom second connection 212b is the outside connection on the bottom connector board. Thus, this scheme is ideal for connecting boards oriented in directions such that the electrical signals travel from outside connections to inside connections.

The electrical path from the first top board connection 211a to the first bottom board connection 211b includes long top surface mount pad 201a and short bottom surface mount pad 201b. The electrical path from second top board connection 202a to second bottom board connection 202b includes short top surface mount pad 202a and long bottom surface mount pad 202b. As can be seen, both electrical paths consist of one long surface mount pad and one short surface mount pad. Both electrical paths are, therefore, of equal length. This ensures that the electrical signals transferred between electrical connections on each of the connector boards will not be out of phase. As may also be seen, first top surface via hole 111a directly overlays first bottom surface via hole 111b and second top surface via hole 112a directly overlays second bottom surface via hole 112b. Thus, the electrical connection between via holes is straight through the mid-plane board at an angle perpendicular to faces of the mid-plane board. This allows for a straight through drilling procedure in construction of the mid-plane board.

Figure 3:
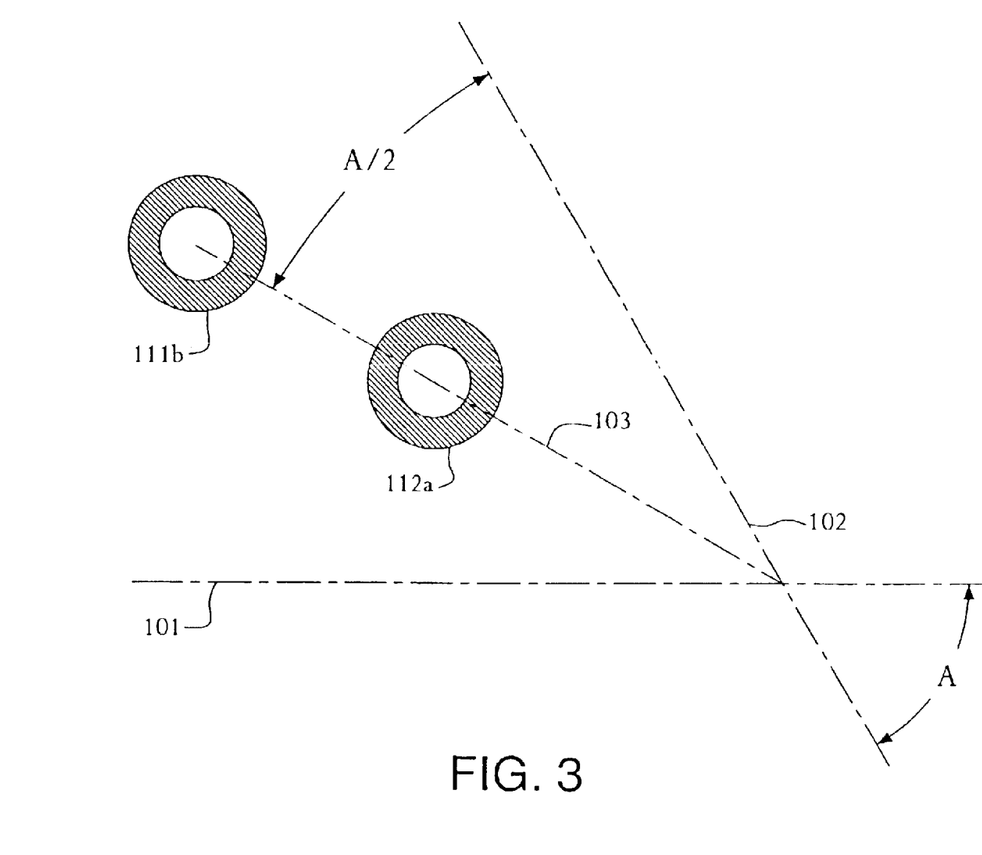
FIG. 3 illustrates a diagram of the second embodiment of the electrical connection system with the via holes fixed on an axis that bisects the angle of misalignment of the connector boards.

FIG. 3 illustrates a diagram of a second embodiment of the electrical Connection system with the via holes fixed on an axis that bisects the angle of misalignment of the connector boards. Misalignment angle A represents the angle of misalignment of top connector board 101 and bottom connector board 102. Bisecting axis 103 bisects angle A. Top surface via holes 111a and 112a are fixed along bisecting axis 103.

Figure 4:
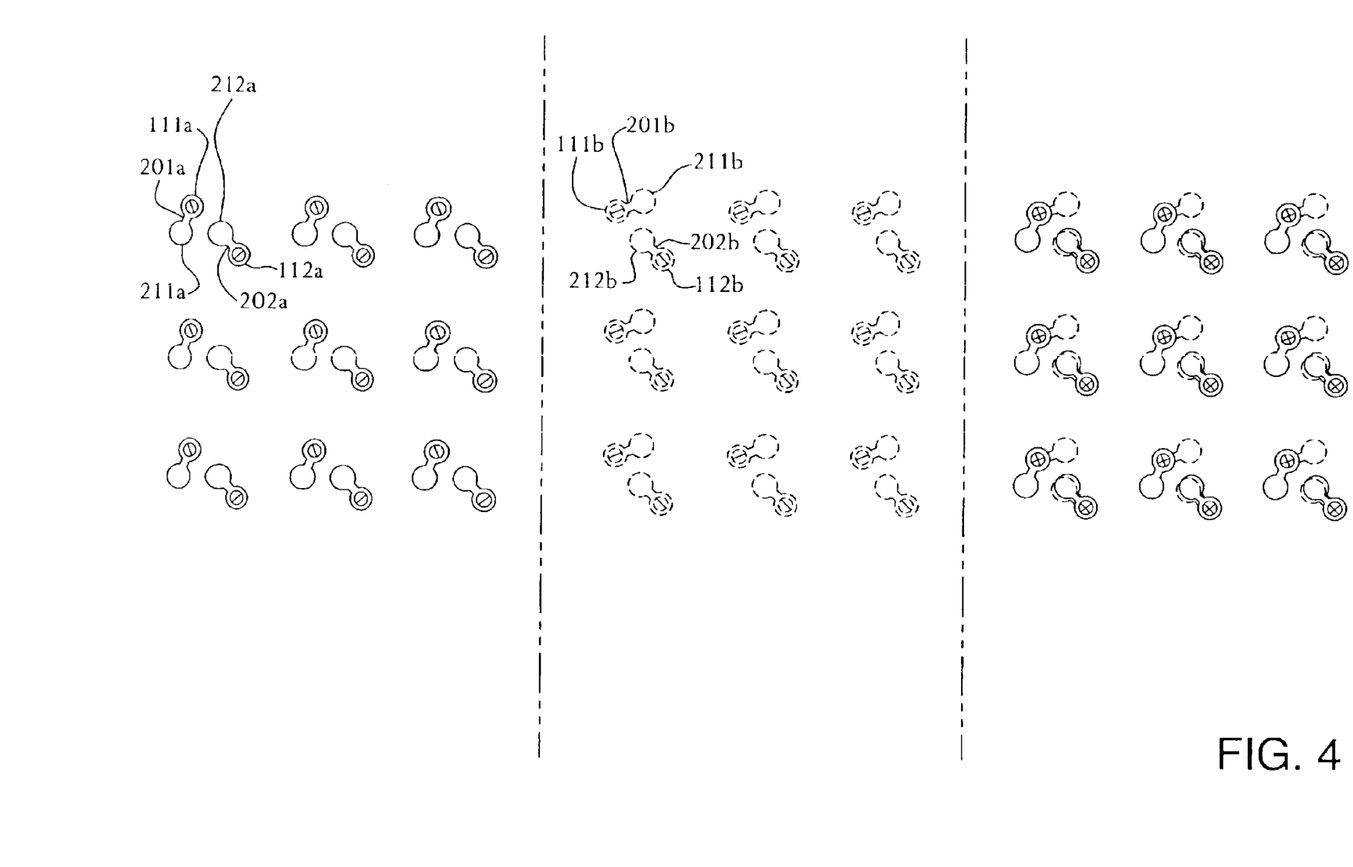
FIG. 4 illustrates a diagram of the second embodiment adapted to a solder on surface mount connector where the front and backside daughter boards are orthogonal to each other.

FIG. 4 illustrates a diagram of a second embodiment adapted to a solder on surface mount connector where the front and backside daughter boards are orthogonal (misalignment angle A=90 degrees). The first column of FIG. 4 illustrates a top view of the top surface of the PWB. Top surface mount pads 201a and 202a connect top daughter board connections 211a and 212a to via holes 111 and 112. The second column of FIG. 4 illustrates a top view of the bottom surface of the PWB. Bottom surface mount pads 201b and 202b (shown by dashed lines) connect bottom daughter board connections 211b and 212b to via holes 111 and 112. The third column of FIG. 4 illustrates a top view of the top surface and bottom surface of the PWB overlaid. In this scheme, both first connections 211a,b are the outside connections, and both second connections 212a,b are the inside connections. Thus, this scheme is ideal for connecting boards oriented in directions such that the electrical signals travel from outside connections to outside connections and inside connections to inside connections.

The electrical path from the first top board connection 211a to the first bottom board connection 211b includes top surface mount pad 201a and bottom surface mount pad 201b. The electrical path from second top board connection 212a to second bottom board connection 212b includes top surface mount pad 202a and bottom surface mount pad 202b. In this scheme, the length of all surface mount pads are equal because the distance from each via hole to each electrical connector is equal. All electrical paths are, therefore, of equal length.

Figure 5:
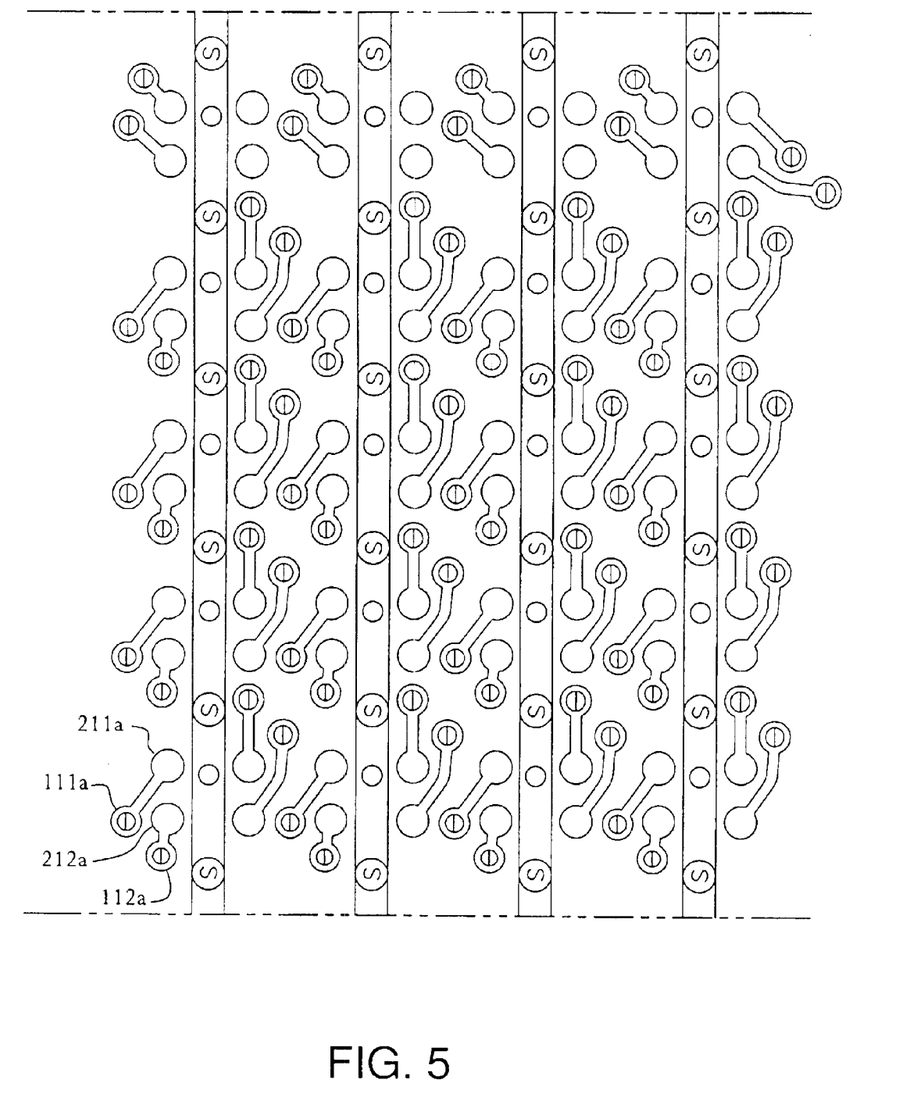
FIG. 5 illustrates a top view of the top surface of a mother board with two exemplary 5×8 headers on opposite sides of the mother board.
Figure 6:
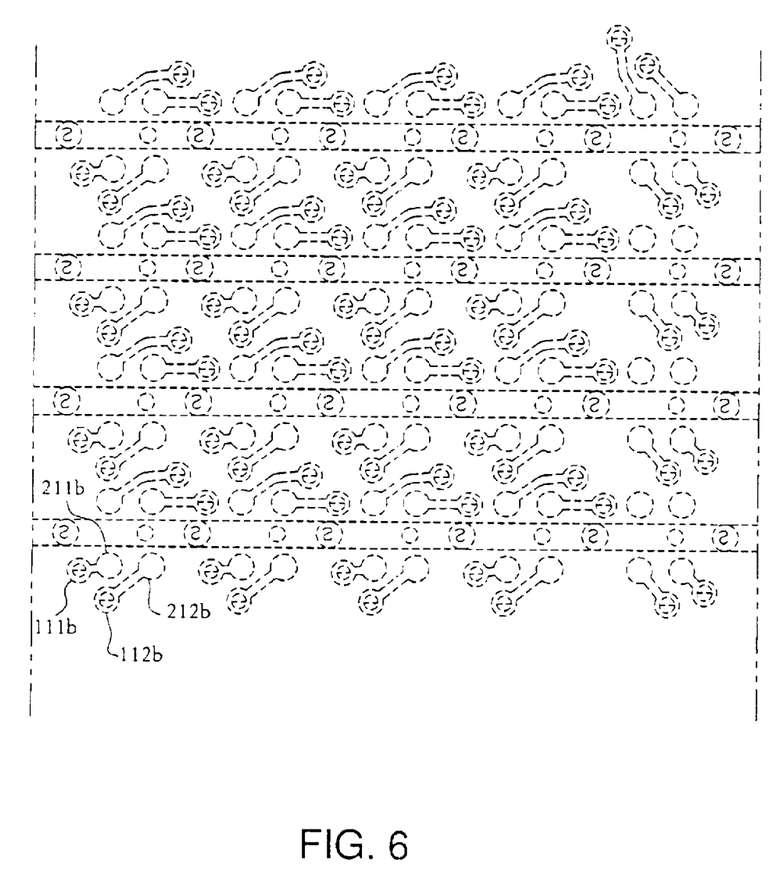
FIG. 6 illustrates a top view of the bottom surface of a mother board with two exemplary 5×8 headers on opposite sides of the mother board.
Figure 7:
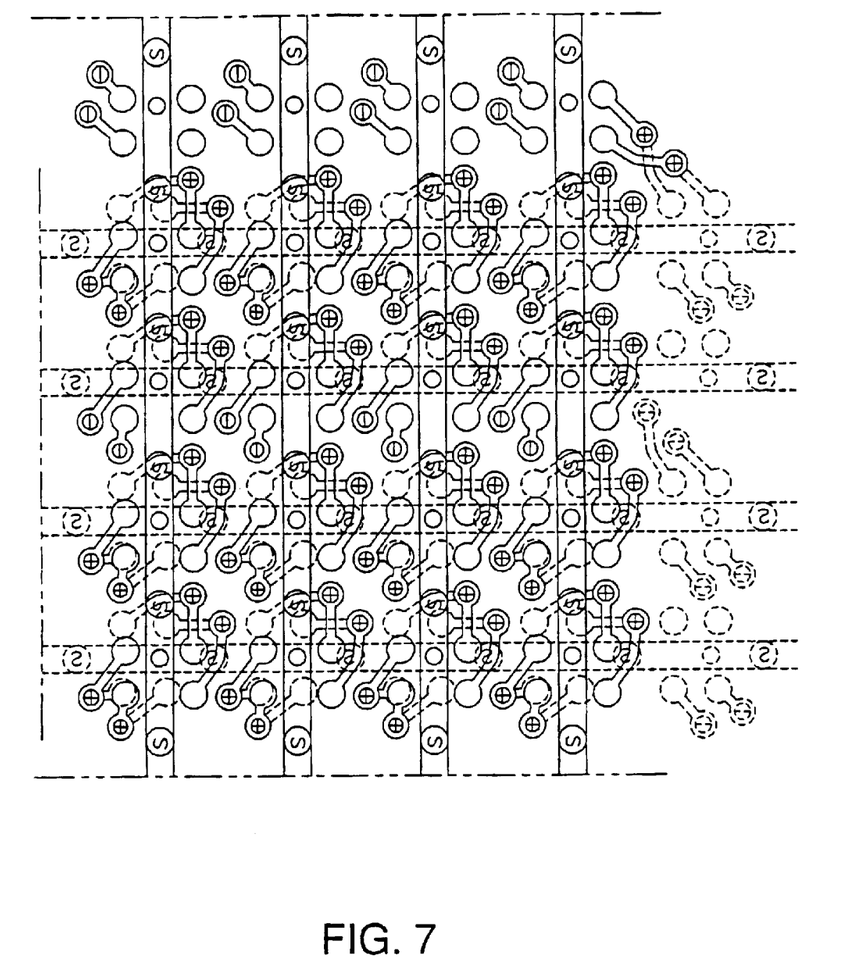
FIG. 7 illustrates a top view of the top surface and bottom surface of a mother board overlaid with two exemplary 5×8 headers on opposite sides of the mother board.
Figure 8:
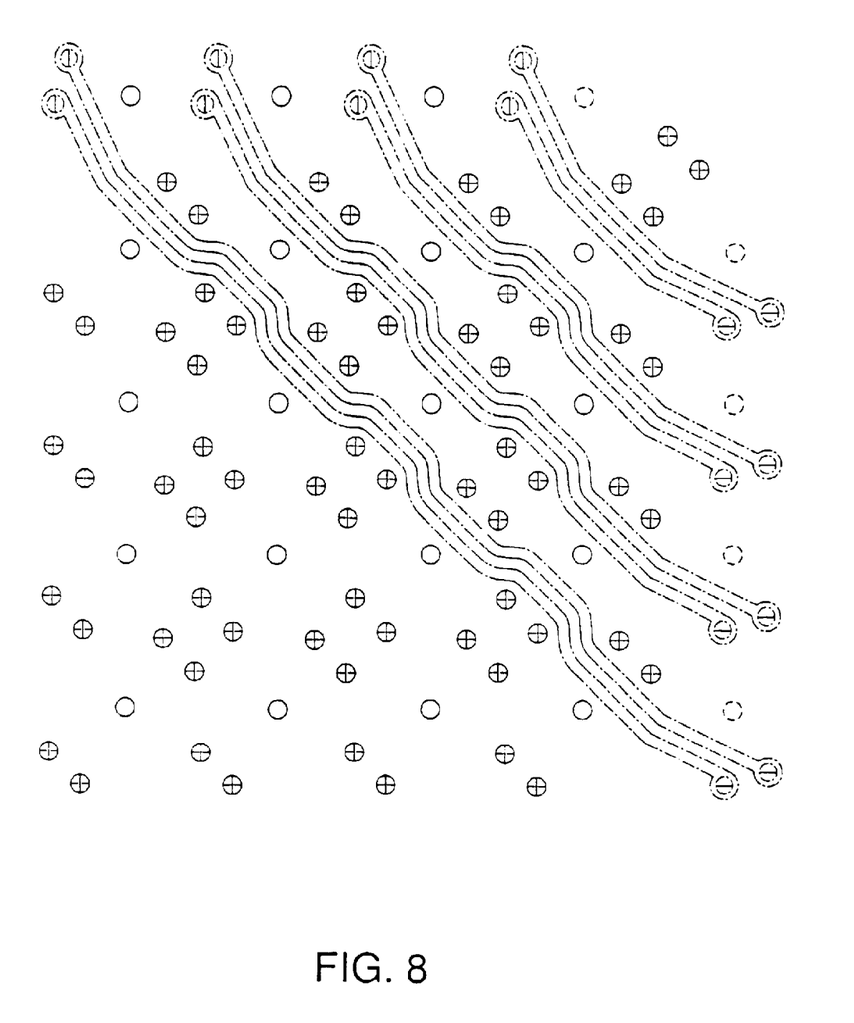
FIG. 8 illustrates a view of the interlayer routing between unmatched pairs of connections of two exemplary 5×8 headers on opposite sides of the mother board.

FIGS. 5–8 illustrate how the first routing scheme discussed generally in FIGS. 1 and 2 would be specifically implemented to the connection of two exemplary 5×8 headers on opposite sides of the mother board. This illustration is for exemplary purposes only and is no way intended to limit the scope of this invention. FIG. 5 illustrates a top view of the top surface of a mother board with two exemplary 5×8 headers on opposite sides of the mother board. FIG. 6 illustrates a top view of the bottom surface of the mother board. FIG. 7 illustrates a top view of the top surface and bottom surface of the mother board overlaid. There is a total of 40 pairs of connections. However, as is apparent from an examination of FIGS. 5–7, the routing scheme of this invention can only be applied to 33 of the 40 total pairs. The pattern in this case is a combination of two 4×4 patterns for a subtotal of 32 pairs. The 33$^{rd}$ pair is the one of a kind pair in the top right corner of the diagrams. The 7 remaining pairs of the top most row and the right most column must be connected using the interlayer routing scheme shown in FIG. 8. While the invention has been described and illustrated with reference to specific embodiments, those skilled in the art will recognize that modification and variations may be made without departing from the principles of the invention as described above and set forth in the following claims. For example, while the invention has been described as being used to connect orthogonal first and second printed circuit boards, the invention may be used to connect printed circuit boards at any angle of misalignment. Furthermore, first and second printed circuit boards may contain any size pattern of connections and is not intended to be limited to a five by eight pattern of connections. Accordingly, reference should be made to the appended claims as indicating the scope of the invention.

What is claimed:

1. A routing system for interconnecting two surface mounted printed circuit boards comprising:
    a mid-plane printed circuit board including a first face and a second face, said second face parallel to said first face;
    a first printed circuit board surface mounted on said first face of said mid-plane printed circuit board, said first printed circuit board containing pairs of electrical connections;
    a second printed circuit board surface mounted on said second face of said mid-plane printed circuit board, said second printed circuit board containing pairs of electrical connections, said second printed circuit board mounted at an angle to said first printed circuit board;
    a plurality of pairs of via holes on said first and second faces of said mid-plane printed circuit board positioned with respect to the angle of misalignment of said first and second printed circuit boards, said pairs of via holes on said first face of said mid-plane printed circuit board directly overlaying said pairs of via holes on said second face of said mid-plane printed circuit board; and
    a plurality of electrical paths through said overlaying pairs of via holes and through electrically conductive pads mounted on said first and second faces of said mid-plane printed circuit board connecting said pairs of electrical connections on said first printed circuit board to said electrical connections on said second printed circuit board.

2. A system as in claim 1, wherein said pairs of via holes are positioned such that:
    A) each via hole in each of said pairs of via holes is fixed on an axis perpendicular to an axis that bisects the angle of misalignment of said first and second printed circuit boards; and
    B) both via holes in each of said pairs of via holes are equidistant from a point on an axis that bisects the angle of misalignment of said first and second printed circuit boards.

3. A system as in claim 1, wherein said pairs of via holes are positioned such that:
    A) each via hole in each of said pairs of via holes is fixed on an axis that bisects the angle of misalignment of said first and second printed circuit boards; and
    B) The distance between the first via hole in each of said pairs of via holes and the first electrical connection in one of said pairs of electrical connections is equal to the distance between the second via hole in each of said pairs of via holes and the second electrical connection in one of said pairs of electrical connections.

4. A system as in claim 1, wherein said electrical paths are substantially equal in length.

5. A system as in claim 1, wherein said electrical paths consist of:
    a plurality of first face electrically conductive surface mount pads mounted on said first face of said mid-plane printed circuit board, each of said first face electrically conductive surface mount pads connecting one of said electrical connections on said first printed circuit board to one of said via holes on said first face of said mid-plane printed circuit board;
    an electrically conductive trace connecting each of said via holes on said second face of said mid-plane printed circuit board with the directly overlaying via hole on said first face of said mid-plane printed circuit board; and
    a plurality of second face electrically conductive surface mount pads mounted on said second face of said mid-plane printed circuit board, each of said second face electrically conductive surface mount pads connecting one of said electrical connections on said second printed circuit board to one of said via holes on said second face of said mid-plane printed circuit board.

6. A system as in claim 5, wherein said electrically conductive traces pass straight through said mid-plane printed circuit board at an angle perpendicular to said mid-plane printed circuit board.

7. A system as in claim 5, wherein said electrically conductive traces are substantially equal in length.

8. A system as in claim 5, wherein said first face electrically conductive surface mount pads are substantially equal in length.

9. A system as in claim 5, wherein said second face electrically conductive surface mount pads are substantially equal in length.

10. A system as in claim 5, wherein said first face electrically conductive surface mount pads are substantially equal in length to said second face electrically conductive surface mount pads.

11. A system as in claim 5, wherein each of said first face surface mount pads connecting the first electrical connection in each of said pairs of electrical connections is a long surface mount pad and each of said first face surface mount pads connecting the second electrical connection in each of said pairs of electrical connections is a short surface mount pad.

12. A system as in claim 11, wherein each of said long surface mount pads is substantially equal in length.

13. A system as in claim 11, wherein each of said short surface mount pads is substantially equal in length.

14. A system as in claim 5, wherein each of said second face surface mount pads connecting the first electrical connection in each of said pairs of electrical connections is a short surface mount pad and each of said second face surface mount pads connecting the second electrical connection in each of said pairs of electrical connections is a long surface mount pad.

15. A system as in claim 14, wherein each of said long surface mount pads is substantially equal in length.

16. A system as in claim 14, wherein each of said short surface mount pads is substantially equal in length.

17. A system as in claim 1, wherein said first and second printed circuit boards are orthogonal.

18. A system as in claim 1, wherein said first and second printed circuit boards are five by eight headers.

19. A system for interconnecting two surface mounted printed circuit boards comprising:
- a mid-plane printed circuit board including a first face and a second face, said second face parallel to said first face;
- a first printed circuit board surface mounted on said first face of said mid-plane printed circuit board, said first printed circuit board containing pairs of electrical connections;
- a second printed circuit board surface mounted on said second face of said mid-plane printed circuit board, said second printed circuit board containing pairs of electrical connections, said second printed circuit board mounted at an angle to said first printed circuit board;
- a plurality of pairs of via holes on said first and second faces of said mid-plane printed circuit board positioned such that:
  A) Each via hole in each of said pairs of via holes is fixed on an axis perpendicular to an axis that bisects the angle of misalignment of said first and second printed circuit boards;
  B) Both via holes in each of said pairs of via holes is equidistant from a point on an axis that bisects the angle of misalignment of said first and second printed circuit boards; and
  C) Each of said pairs of via holes on said first face of said mid-plane printed circuit board is directly overlaying one of said pairs of via holes on said second face of said mid-plane printed circuit board;
- a plurality of electrically conductive traces connecting each of said via holes in said pairs of via holes on said second face of said mid-plane printed circuit board to one of said directly overlaying via holes in said pairs of via holes on said first face of said mid-plane printed circuit board, said electrically conductive traces being substantially equal in length;
- a plurality of long first face electrically conductive surface mount pads mounted on said first face of said mid-plane printed circuit board, said long first face electrically conductive surface mount pads connecting the first connection in each of said pairs of electrical connections on said first printed circuit board to the first via hole in each of said pairs of via holes on said first face of said mid-plane printed circuit board, said long first face electrically conductive surface mount pads being substantially equal in length;
- a plurality of short first face electrically conductive surface mount pads mounted on said first face of said mid-plane printed circuit board, said short first face electrically conductive surface mount pads connecting the second connection in each of said pairs of electrical connections on said first printed circuit board to the second via hole in each of said pairs of via holes on said first face of said mid-plane printed circuit board, said short first face electrically conductive surface mount pads being substantially equal in length;
- a plurality of short second face electrically conductive surface mount pads mounted on said second face of said mid-plane printed circuit board, said short second face electrically conductive surface mount pads connecting the first connection in each of said pairs of electrical connections on said second printed circuit board to the first via hole in each of said pairs of via holes on said second face of said mid-plane printed circuit board, said short second face electrically conductive surface mount pads being substantially equal in length; and
- a plurality of long second face electrically conductive surface mount pads mounted on said second face of said mid-plane printed circuit board, each of said long second face electrically conductive surface mount pads connecting the second connection in each of said pairs of electrical connections on said second printed circuit board to the second via hole in each of said pairs of via holes on said second face of said mid-plane printed circuit board, said long second face electrically conductive surface mount pads being substantially equal in length.

20. A system for interconnecting two surface mounted printed circuit boards comprising:
- a mid-plane printed circuit board including a first face and a second face, said second face parallel to said first face;
- a first printed circuit board surface mounted on said first face of said mid-plane printed circuit board, said first printed circuit board containing pairs of electrical connections;
- a second printed circuit board surface mounted on said second face of said mid-plane printed circuit board, said second printed circuit board containing pairs of electrical connections, said second printed circuit board mounted at an angle to said first printed circuit board;
- a plurality of pairs of via holes on said first and second faces of said mid-plane printed circuit board positioned such that:
  A) each via hole in each of said second face pairs of via holes is fixed on an axis that bisects the angle of misalignment of said first and second printed circuit boards;

B) The distance between the first via hole in each of said second face pairs of via holes and the first electrical connection in one of said pairs of electrical connections on said second printed circuit board is equal to the distance between the second via hole in each of said second face pairs of via holes and the second electrical connection in one of said pairs of electrical connections on said second printed circuit board; and C) each of said pairs of via holes on said first face of said mid-plane printed circuit board is directly overlaying one of said pairs of via holes on said second face of said mid-plane printed circuit board;

a plurality of electrically conductive traces connecting each of said via holes in said pairs of via holes on said second face of said mid-plane printed circuit board to one of said directly overlaying via holes in said pairs of via holes on said first face of said mid-plane printed circuit board, said electrically conductive traces being substantially equal in length;

a plurality of first face electrically conductive surface mount pads mounted on said first face of said mid-plane printed circuit board, each of said first face electrically conductive surface mount pads connecting one of said electrical connections on said first printed circuit board to one of said via holes on said first face of said mid-plane printed circuit board, said first face electrically conductive surface mount pads being substantially equal in length; and a plurality of second face electrically conductive surface mount pads mounted on said second face of said mid-plane printed circuit board, each of said second face electrically conductive surface mount pads connecting one of said electrical connections on said second printed circuit board to one of said via holes on said second face of said mid-plane printed circuit board, said second face electrically conductive surface mount pads being substantially equal in length to said first face electrically conductive surface mount pads.

21. A routing system for interconnecting two surface mounted printed circuit boards comprising:

a mid-plane printed circuit board including a first face and a second face, said second face parallel to said first face;

a first printed circuit board surface mounted on said first face of said mid-plane printed circuit board, said first printed circuit board containing pairs of electrical connections;

a second printed circuit board surface mounted on said second face of said mid-plane printed circuit board, said second printed circuit board containing pairs of electrical connections, said second printed circuit board mounted at an angle to said first printed circuit board;

a plurality of pairs of via holes on said first and second faces of said mid-plane printed circuit board, said pairs of via holes on said first face of said mid-plane printed circuit board directly overlaying said pairs of via holes on said second face of said mid-plane printed circuit board, said pairs of via holes positioned such that:

A) each via hole in each of said pairs of via holes is fixed on an axis that bisects the angle of misalignment of said first and second printed circuit boards; and B) both via holes in each of said pairs of via holes are equidistant from a point on an axis that bisects the angle of misalignment of said first and second printed circuit boards; and a plurality of electrical paths through said overlaying pairs of via holes connecting said pairs of electrical connections on said first printed circuit board to said electrical connections on said second printed circuit board.

22. A routing system for interconnecting two surface mounted printed circuit boards comprising:

a mid-plane printed circuit board including a first face and a second face, said second face parallel to said first face;

a first printed circuit board surface mounted on said first face of said mid-plane printed circuit board, said first printed circuit board containing pairs of electrical connections;

a second printed circuit board surface mounted on said second face of said mid-plane printed circuit board, said second printed circuit board containing pairs of electrical connections, said second printed circuit board mounted at an angle to said first printed circuit board;

a plurality of pairs of via holes on said first and second faces of said mid-plane printed circuit board, said pairs of via holes on said first face of said mid-plane printed circuit board directly overlaying said pairs of via holes on said second face of said mid-plane printed circuit board, said pairs of via holes positioned such that:

A) each via hole in each of said pairs of via holes is fixed on an axis perpendicular to an axis that bisects an angle of misalignment of said first and second printed circuit boards; and B) a distance between the first via hole in each of said pairs of via holes and a first electrical connection in one of said pairs of electrical connections is equal to distance between a second via hole in each of said pairs of via holes and the second electrical connection in one of said pairs of electrical connections; and a plurality of electrical paths through said overlaying pairs of via holes connecting said pairs of electrical connections on said first printed circuit board to said electrical connections on said second printed circuit board.

23. A routing system for interconnecting two surface mounted printed circuit boards comprising:

a mid-plane printed circuit board including a first face and a second face, said second face parallel to said first face;

a first printed circuit board surface mounted on said first face of said mid-plane printed circuit board, said first printed circuit board containing pairs of electrical connections;

a second printed circuit board surface mounted on said second face of said mid-plane printed circuit board, said second printed circuit board containing pairs of electrical connections, said second printed circuit board mounted at an angle to said first printed circuit board;

a plurality of pairs of via holes on said first and second faces of said mid-plane printed circuit board positioned with respect to the angle of misalignment of said first and second printed circuit boards, said pairs of via holes on said first face of said mid-plane printed circuit board directly overlaying said pairs of via holes on said second face of said mid-plane printed circuit board; and a plurality of electrical paths through said overlaying pairs of via holes connecting said pairs of electrical connections on said first printed circuit board to said electrical connections on said second printed circuit board, said electrical paths comprising:

a plurality of first face electrically conductive surface mount pads mounted on said first face of said mid-plane printed circuit board, each of said first face electrically conductive surface mount pads connecting one of said electrical connections on said first printed circuit board to one of said via holes on said first face of said mid-plane printed circuit board;

an electrically conductive trace connecting each of said via holes on said second face of said mid-plane printed circuit board with the directly overlaying via hole on said first face of said mid-plane printed circuit board; and a plurality of second face electrically conductive surface mount pads mounted on said second face of said mid-plane printed circuit board, each of said second face electrically conductive surface mount pads connecting one of said electrical connections on said second printed circuit board to one of said via holes on said second face of said mid-plane printed circuit board.

* * * * *